United States Patent
Dannenberg et al.

(10) Patent No.: US 9,778,323 B2
(45) Date of Patent: Oct. 3, 2017

(54) MAGNETIC SENSOR DEVICE AND MANUFACTURING METHOD FOR A MAGNETIC SENSOR DEVICE

(71) Applicant: Robert Bosch GmbH, Stuttgart (DE)

(72) Inventors: Arne Dannenberg, Metzingen (DE); Achim Breitling, Leinfelden-Echterdingen (DE); Christian Patak, Reutlingen (DE); Volkmar Senz, Metzingen (DE); Sevki Gencol, Kirchentellinsfurt (DE); Tamer Sinanoglu, Reutlingen-Ohmenhausen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/034,650

(22) PCT Filed: Sep. 5, 2014

(86) PCT No.: PCT/EP2014/068976
§ 371 (c)(1),
(2) Date: May 5, 2016

(87) PCT Pub. No.: WO2015/067391
PCT Pub. Date: May 14, 2015

(65) Prior Publication Data
US 2016/0291096 A1 Oct. 6, 2016

(30) Foreign Application Priority Data
Nov. 6, 2013 (DE) .................... 10 2013 222 538

(51) Int. Cl.
*G01R 33/04* (2006.01)
*G01R 33/00* (2006.01)

(52) U.S. Cl.
CPC ..... *G01R 33/0005* (2013.01); *G01R 33/0052* (2013.01); *G01R 33/04* (2013.01)

(58) Field of Classification Search
CPC ...................................... G01R 33/04
(Continued)

(56) References Cited

U.S. PATENT DOCUMENTS

| 2011/0316531 | A1* | 12/2011 | Schatz | G01R 33/0206 324/244 |
| 2013/0099783 | A1* | 4/2013 | Kubik | G01R 33/096 324/252 |
| 2013/0320969 | A1* | 12/2013 | Reichenbach | G01R 33/0052 324/247 |

FOREIGN PATENT DOCUMENTS

| KR | 2006/0038511 | 5/2006 |
| WO | WO 2008/016198 | 2/2008 |
| WO | WO 2011/134904 | 11/2011 |

OTHER PUBLICATIONS

International Search Report for PCT/EP2014/068976, dated Dec. 4, 2014.

* cited by examiner

*Primary Examiner* — Reena Aurora
(74) *Attorney, Agent, or Firm* — Norton Rose Fulbright US LLP; Gerard Messina

(57) ABSTRACT

A magnetic sensor device having a first magnetic core structure which is aligned along a first central longitudinal axis and has at least one first coil, and having a second magnetic core structure which includes at least one second coil, the second magnetic core structure extending from a first end face of the second magnetic core structure along a second central longitudinal axis to a second end face of the second magnetic core structure, the second central longitudinal axis lying in a plane aligned in a direction normal to (Continued)

the first central longitudinal axis, and the second magnetic core structure being positioned in relation to the first magnetic core structure in such a way that a clearance between the first end face of the second magnetic core structure and a first center of mass of the first magnetic core structure is less than 20% of a maximum extension of the first magnetic core structure along the first central longitudinal axis.

5 Claims, 3 Drawing Sheets

(58) Field of Classification Search
USPC .......................................................... 324/253
See application file for complete search history.

MAGNETIC SENSOR DEVICE AND MANUFACTURING METHOD FOR A MAGNETIC SENSOR DEVICE

FIELD

The present invention relates to a magnetic sensor device. Moreover, the present invention relates to a method for manufacturing a magnetic sensor device.

BACKGROUND INFORMATION

Fluxgate magnetometers, which are used in digital compasses, for example, are available. A fluxgate magnetometer, which may also be referred to as a Förster probe, has a drive coil and a detector coil which are guided around a magnet core. Three fluxgate magnetometers, for example, are aligned in the digital compass such that the three central longitudinal axes of the magnet cores are aligned at a right angle to each other.

For example, fluxgate magnetometers are described in PCT Publications WO 2008/016198 A1 and WO 2011/134904 A1, and Korean Application No. KR 2006 0038511 A. The described fluxgate magnetometers each have a first magnetic core structure extending along a first central longitudinal axis and a second magnetic core structure, which extends from a first end face along a second central longitudinal axis to a second end face, the second central longitudinal axis lying in a plane aligned in a direction normal to the first central longitudinal axis, and a clearance between the first end face of the second magnetic core structure and a center of mass of the first magnetic core structure being less than 20% of a maximum extension of the first magnetic core structure along the first central longitudinal axis.

SUMMARY

Example embodiments of the present invention make it possible to measure three magnetic field components of a magnetic field that are aligned in a direction normal to each other, the measurement being (virtually) free of transverse influences with a placement of the coils and magnetic core structures used for this purpose within a relatively small volume. In particular, example embodiments of the present invention make it possible to prevent an interference effect that an uncontrolled collapse or an uncontrolled orientation of a magnetization direction of a passive measuring element may have on a measured value of an active measuring element. As a result of the reducible/correctable interference effects of the measuring elements on each other provided by the present invention, the magnetic core structures of the measuring elements are able to be placed closer to each other. This allows a miniaturization of the magnetic sensor device of the present invention, despite its design for detecting three magnetic field components that are aligned in a direction normal to each other.

Because of the miniaturization, more magnetic sensor devices are able to be produced on a wafer which is used as a shared starting material. The present invention therefore reduces the manufacturing costs involved in the manufacture of a magnetic sensor device. In addition, the miniaturization of the magnetic sensor device provides a less complex design, and the required space for the magnetic sensor device is moreover able to be reduced significantly on account of its miniaturization, which means that the magnetic sensor device can be put to wider use. Because of its small space requirement and lighter weight, for example, the magnetic sensor device is able to be used to advantage in a mobile communications device, e.g., a smartphone. However, it is pointed out that the magnetic sensor device according to the invention can also be used in a multitude of other devices.

Furthermore, this may ensure that a third measuring element, made up of at least the third magnetic core structure and the at least one third coil, has little or no effect on the measurements carried out with the aid of the at least one first coil and/or the measurements carried out with the aid of the at least one second coil. In the same way it can thereby be ensured that the first measuring element, at least made up of the first magnetic core structure and the at least one first coil, and/or that the second measuring element, made up of the at least one second magnetic core structure and the at least one second coil, have/has little or no effect on the measurements carried out with the aid of the at least one third coil.

In one advantageous specific embodiment, at least one drive coil and/or at least one detector coil as the at least one coil are disposed on at least one of the at least two magnetic core structures. The magnetic sensor device according to the present invention may therefore also be a fluxgate.

A corresponding manufacturing process for a magnetic sensor device may be executed. The manufacturing process can be refined further according to the different specific embodiments of the magnetic sensor device.

BRIEF DESCRIPTION OF THE DRAWINGS

Additional features and advantages of the present invention are explained below with reference to the figures.

DETAILED DESCRIPTION OF EXAMPLE EMBODIMENTS

Figure 1A:
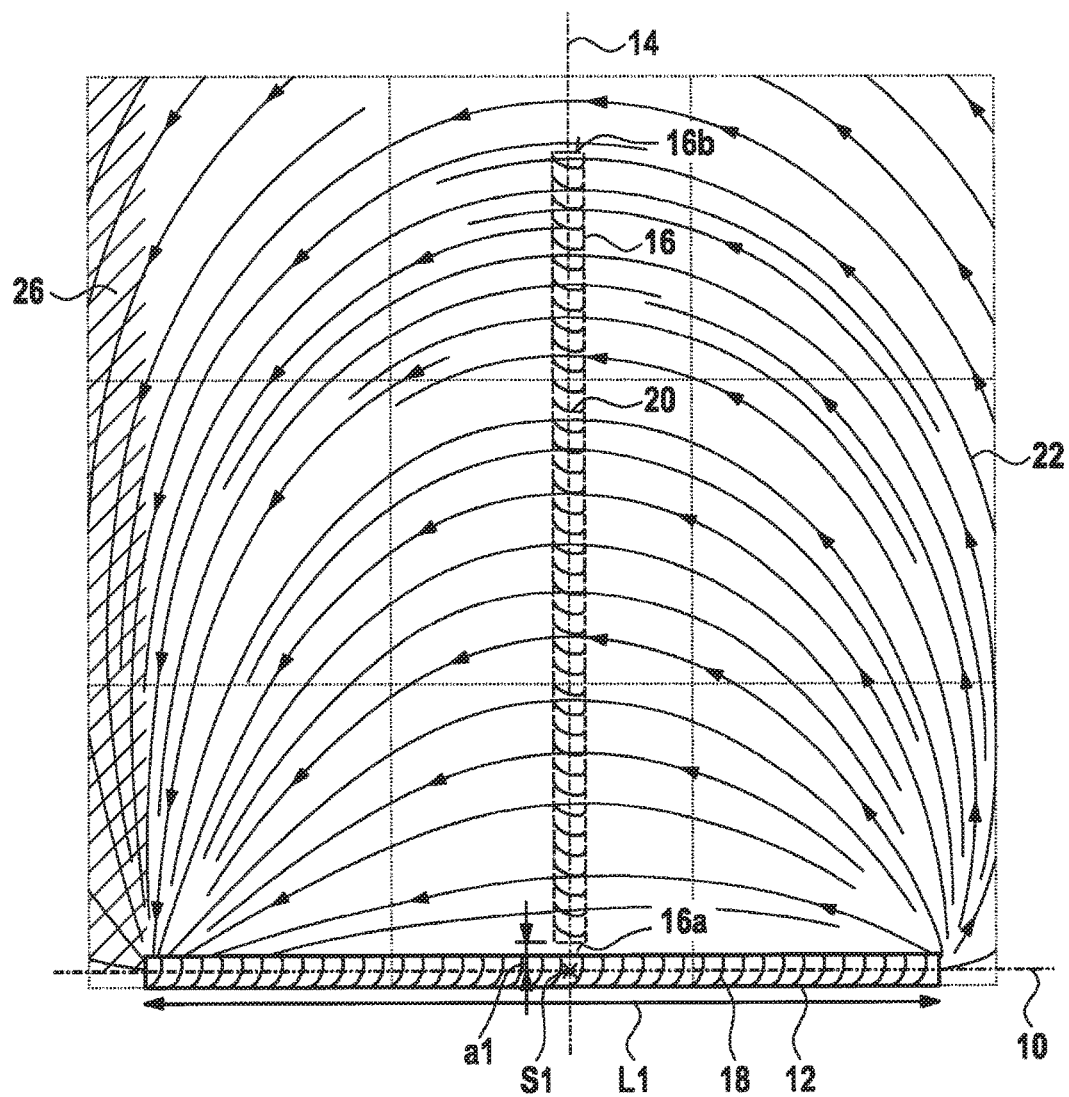
FIGS. 1a and 1b show schematic representations of a first specific embodiment of the magnetic sensor device
Figure 1B:
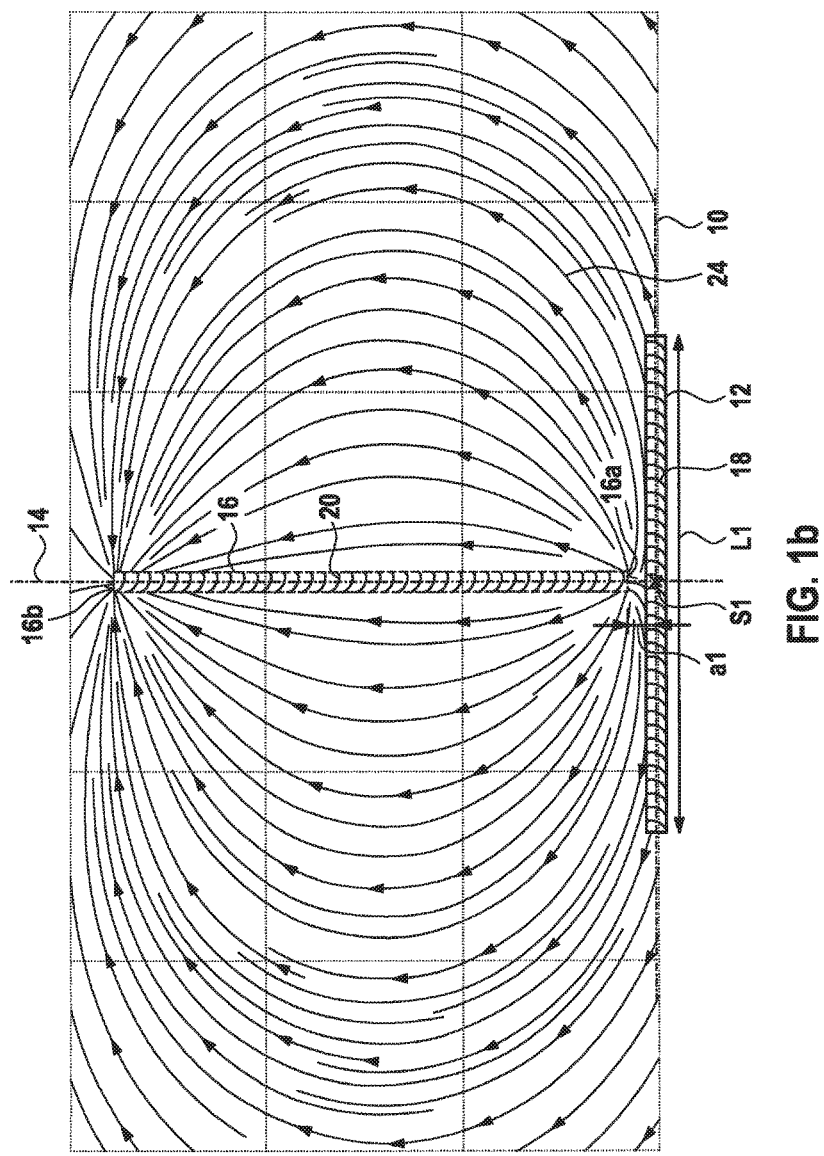

FIGS. 1a and 1b show schematic representations of a conventional magnetic sensor device.

The magnetic sensor device shown schematically in FIGS. 1a and 1b has a first magnetic core structure 12, which is aligned along a first central longitudinal axis 10, and a second magnetic core structure 16, which extends from a first end face 16a of second magnetic core structure 16 along a second central longitudinal axis 14 to a second end face 16b of second magnetic core structure 16. Each magnetic core structure 12 and 16 includes at least one (schematically represented) coil 18 and 20, the windings of the at least one first coil 18 of first magnetic core structure 12 extending around first central longitudinal axis 10, and the windings of the at least one second coil 20 of second magnetic core structure 16 extending around second central longitudinal axis 14. For instance, one drive coil and one detector coil may be disposed/developed on magnetic core structures 12 and 16 in each case. However, a magnetic core structure 12 and 16 may also include multiple drive coils and/or multiple detector coils.

First magnetic core structure 12 having the at least one first coil 18 may be used as first measuring element. Similarly, second magnetic core structure 16 having the at least one second coil 20 may be used as second measuring element. Because of the development of the windings of the at least one first coil 18, a detection direction of the at least one first coil 18/the first measuring element lies on first central longitudinal axis 10.

Second central longitudinal axis 14 represents a detection direction of the at least one second coil 20/the second measuring element.

In each case first end face 16a and second end face 16b may be understood to refer to an area of mass points of second magnetic core structure 16 that lies along second central longitudinal axis 14 at the greatest distance from a second center of mass/center point of second magnetic core structure 16. The mass points at one end of second magnetic core structure 16, whose projection onto second central longitudinal axis 14 has a first greatest distance from a projection of the second center of mass/center point of second magnetic core structure 16 onto second central longitudinal axis 14, may thus be referred to as first end face 16a. Similarly, the mass points at another end of second magnetic core structure 16, whose projection onto second central longitudinal axis 14 has a second greatest distance from the projection of the second center of mass/center point of second magnetic core structure 16 onto second central longitudinal axis 14, may thus be referred to as second end face 16b. (The first greatest distance and the second greatest distance may be equal or different.)

Each first end face 16a and second end face 16b may consequently also be denoted as an outer or end face of second magnetic core structure 16. First end face 16a and/or second end face 16b in particular may be aligned in a direction normal to second central longitudinal axis 14. Hereinafter, first end face 16a refers to the particular surface of the two end faces 16a and 16b that lies closer to a first center of mass S1 of first magnetic core structure 12.

The position of the second magnetic core structure 16 in relation to first magnetic core structure 12 is such that second central longitudinal axis 14 lies in a plane that is aligned in a direction normal to first central longitudinal axis 10. In addition, a clearance a1 between first end face 16a of second magnetic core structure 16 and first center of mass S1 of first magnetic core structure 12 is less than 20% of a maximum extension L1 of first magnetic core structure 12 along first central longitudinal axis 10. Clearance a1 of first end face 16a of second magnetic core structure 16 is a minimum distance between all points of first end face 16a of second magnetic core structure 16 and first center of mass S1 of first magnetic core structure 12. It is expressly pointed out that clearance a1 of first end face 16a of second magnetic core structure 16 is not an average value, but rather a minimum of the distances of all points of first end face 16a of second magnetic core structure 16 from first center of mass S1 of first magnetic core structure 12. Maximum extension L1 of first magnetic core structure 12 along first central longitudinal axis 10 may refer to a length by which first magnetic core structure 12 extends along first central longitudinal axis 10.

Advantages that result from the positioning of second magnetic core structure 16 in relation to first magnetic core structure 12 described in the preceding paragraph are schematically illustrated in FIGS. 1a and 1b. In this connection, FIG. 1a at least partially shows first field lines 22 of a first magnetic field, which is able to be induced by energizing at least one of the at least one first coil(s) 18 or which can be generated by the first measuring element. FIG. 1b shows second field lines 24 of a second magnetic field which is able to be induced by energizing at least one of the at least one second coil(s) 20 or by the second measuring element.

First field lines 22 of the first magnetic field shown in FIG. 1a are aligned (virtually) perpendicular to second central longitudinal axis 14 within a volume of second magnetic core structure 16. As a result, first field lines 22 of the first magnetic field in the volume of first magnetic core structure 12 are (essentially) aligned at a right angle to the detection direction of the at least one second coil 20. It can also be said that first field lines 22 of the first magnetic field in the volume of first magnetic core structure 12 lie (virtually) at a right angle to the detection direction of the second measuring element. As a result, the first magnetic field (as interference field) does not affect or barely affects any measurements carried out by the at least one second coil 20. It can also be said that the effective interference field induced by the first measuring element on the at least one second coil 20 amounts to (virtually) zero.

As can be gathered from FIG. 1b, second field lines 24 of the second magnetic field in a volume of first magnetic core structure 12 have components aligned parallel to first central longitudinal axis 10 different from zero. However the components aligned parallel to first central longitudinal axis 10 in the interior of first magnetic core structure 12 (essentially) average out over the entire maximum extension L1. The formation of an average value of the second magnetic field in first magnetic core structure 12 across maximum extension L1 thus results in (virtually) zero. The influence of the second magnetic field (as interference field) on measurements carried out by the at least one first coil 18 is therefore negligible. In other words, the effective interference field that the second measuring element brings to bear on the first measuring element amounts to (virtually) zero.

The advantageous positioning of magnetic core structures 12 and 16 in relation to each other, where clearance a1 of first end face 16a of second magnetic core structure 16 in relation to first center of mass S1 of first magnetic core structure 12 is at least less than 20% of maximum extension L1, thus has the result that the first measuring element will not induce an interference field on the second measuring element and the second measuring element will not induce an interference field on the first measuring element either. Instead, interference influences of the measuring elements on each other are reduced/prevented despite their relatively close placement.

For a more specific illustration of the advantages of the advantageous positioning of second magnetic core structure 16 in relation to first magnetic core structure 12, a brief discussion of the example of another positioning option for measuring elements will follow. For example, if second magnetic core structure 16 were positioned in the region marked by hatching 26 in FIG. 1a, and if a clearance between first center of mass S1 of first magnetic core structure 12 and first end face 16a of second magnetic core structure 16 would equal approximately one half of maximum extension L1 of first magnetic core structure 12 along first central longitudinal axis 10, then the first measuring element would induce a significant interference field on the second measuring element, which includes magnetic field components in hatched region 26 that are not averaging out.

In contrast, the advantageous positioning of magnetic core structures 12 and 16 in relation to each other shown in FIGS. 1a and 1b offers the advantage that a magnetic field brought about by first magnetic core structure 12 and the at least one first coil 18 has (virtually) no magnetic field components along second central longitudinal axis 14 within the volume of second magnetic core structure 16 (see FIG. 1a). In addition, it is pointed out once again that the components that are oriented parallel to first central longitudinal axis 10 of magnetic field lines 24 in the volume of first magnetic core structure 12 (essentially) average out.

Second magnetic core structure 16 may be positioned in such a way, in particular with respect to first magnetic core structure 12, that clearance a1 between first end face 16a of second magnetic core structure 16 and first center of mass S1 is less than 15%, preferably less than 10%, preferably less than 5%, of maximum extension L1 of first magnetic core structure 12 along first central longitudinal axis 10. In particular, the position of magnetic core structures 12 and 16 relative to each other may be such that they contact each other, i.e., clearance a1 between first end face 16a of second magnetic core structure 16 and first center of mass S1 equals one half of the width of first magnetic core structure 12 (at least in the contact region of second magnetic core structure 16). The adverse effect on measurements as a result of interference fields can thereby be reduced even further.

Magnetic core structures 10 and 16 may be developed in one piece in each case. However, it is pointed out that the term "magnetic core structure" 12 and 16 could also describe a structure that is composed of multiple magnetic cores. Magnetic core structures 12 and 16 may therefore be produced with a large degree of design freedom.

In the specific development of FIGS. 1a and 1b, the position of second magnetic core structure 16 in relation to first magnetic core structure 12 is furthermore such that second central longitudinal axis 14 lies in a plane that is aligned in a direction normal to first central longitudinal axis 10 and encompasses first center of mass S1 of first magnetic core structure 12. This ensures a symmetry of second magnetic field lines 24 in relation to the plane that is aligned in a direction normal to first central longitudinal axis 10 and encompasses first center of mass S1, the symmetry causing second field lines 24 in the volume of first magnetic core structure 12 to average out. Central longitudinal axes 10 and 14 in particular may lie in a (further) shared plane. In addition, second central longitudinal axis 14 may extend through first center of mass S1 of first magnetic core structure 12. This, too, ensures advantageous measurements that are free of interference fields.

Figure 2:
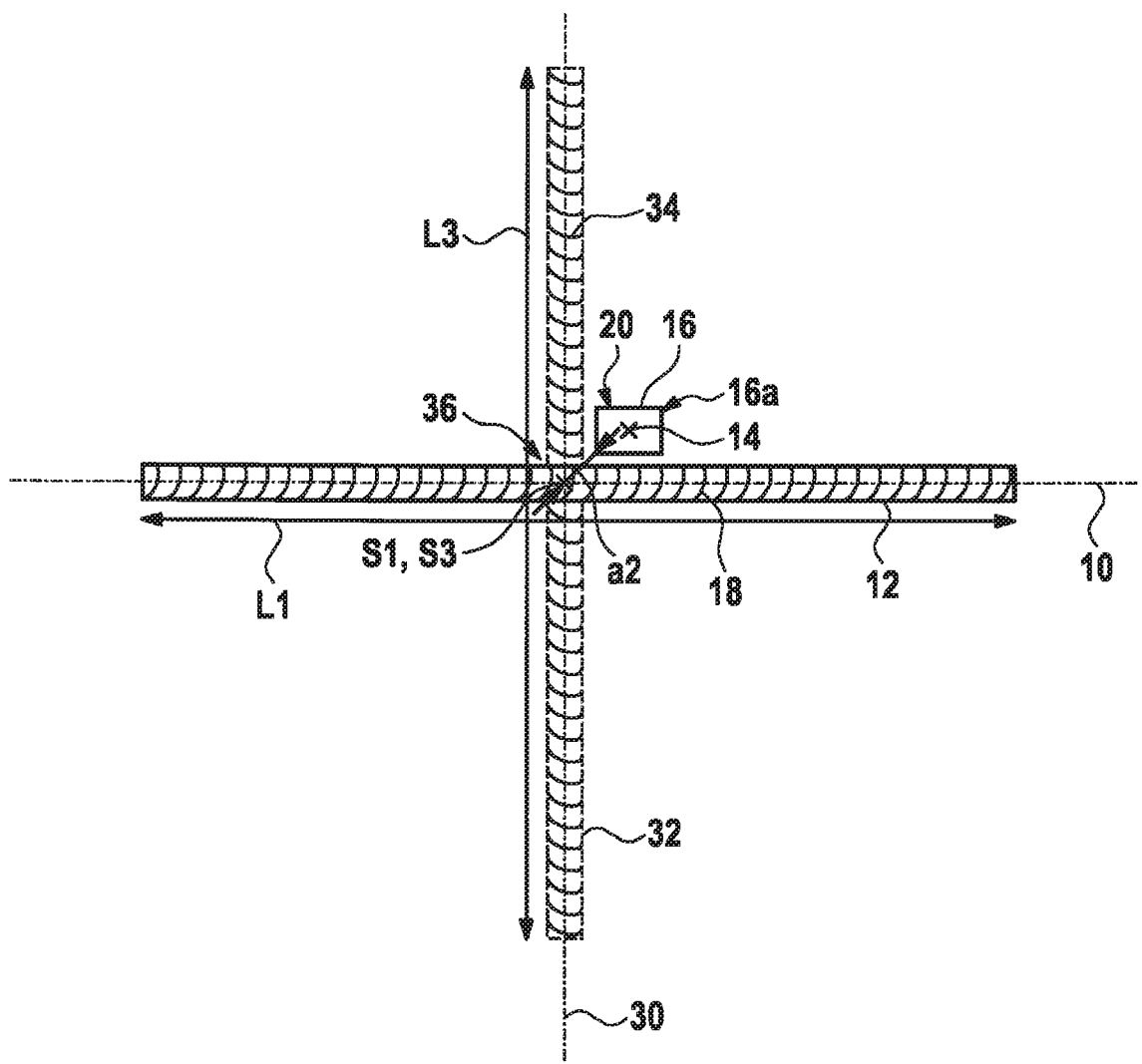
FIG. 2 shows a schematic illustrations of a magnetic sensor device.

FIG. 2 shows a schematic representation of a specific embodiment of the magnetic sensor device.

The magnetic sensor device schematically shown in FIG. 2 includes the previously described magnetic core structures 12 and 16 with their coils 18 and 20. In this specific embodiment as well, the position of second magnetic core structure 16 in relation to first magnetic core structure 12 is such that second central longitudinal axis 14 lies in a plane that is aligned in a direction normal to first central longitudinal axis 10. (In the specific embodiment of FIG. 2, second central longitudinal axis 14 projects perpendicularly from the image plane in which first central longitudinal axis 10 and first end face 16a are situated.) In addition, a clearance a2 between (all points of) first end face 16a of second magnetic core structure 16 and first center of mass S1 of first magnetic core structure 12 is less than 20% of a maximum extension L1 of first magnetic core structure 12 along first central longitudinal axis 10. It is expressly pointed out again that clearance a2 of first end face 16a of second magnetic core structure 16 is not an average value, but rather a minimum of the distances of all points of first end face 16a of second magnetic core structure 16 from first center of mass S1 of first magnetic core structure 12.

In addition to components 12, 16, 18 and 20, the specific embodiment of FIG. 2 also includes a third magnetic core structure 32, which is aligned along a third central longitudinal axis 30 and includes at least one third coil 34. Third central longitudinal axis 30 is aligned in a direction normal to first central longitudinal axis 10 and in a direction normal to second central longitudinal axis 14. The windings of the at least one third coil 34 run around third central longitudinal axis 30 of third magnetic core structure 32. For example, at least one drive coil and/or at least one detector coil as the at least one third coil 34 may be positioned/developed on third magnetic core structure 32. Third magnetic core structure 32 having the at least one third coil 34 may thus be referred to as third measuring element.

The position of third magnetic core structure 32 in relation to first magnetic core structure 12 and second magnetic core structure 16 is such that a clearance between third magnetic core structure 32 and first center of mass S1 of first magnetic core structure 12 is less than 20% of maximum extension L1 of first magnetic core structure 12 along first central longitudinal axis 10, and/or a clearance between third magnetic core structure 32 and a second center of mass of second magnetic core structure 16 is less than 20% of a maximum extension of second magnetic core structure 16 along second central longitudinal axis 14. The clearance between third magnetic core structure 32 and first center of mass S1 of first magnetic core structure 12 (or the second center of mass of second magnetic core structure 16) in particular may be less than 15%, preferably less than 10%, preferably less than 5%, of maximum extension L1 of first magnetic core structure 12 along first central longitudinal axis 10 (or the maximum extension of second magnetic core structure 16 along second central longitudinal axis 14). (In this case the clearance of third magnetic core structure 32 is the smallest clearance of all mass points of third magnetic core structure 32).

An an alternative, the position of third magnetic core structure 32 in relation to first magnetic core structure 12 and second magnetic core structure 16 may also be such that a clearance between first magnetic core structure 12 and a third center of mass S3 of third magnetic core structure 32 is less than 20% of a maximum extension L3 of third magnetic core structure 32 along third central longitudinal axis 30, and/or a clearance between second magnetic core structure 16 and third center of mass S3 of third magnetic core structure 32 is less than 20% of maximum extension L3 of third magnetic core structure 32 along third central longitudinal axis 30. The clearance between first magnetic core structure 12 (or the clearance between second magnetic core structure 16) and third center of mass S3 of third magnetic core structure 32 in particular may be less than 15%, preferably less than 10%, preferably less than 5%, of maximum extension L3 of third magnetic core structure 32 along third central longitudinal axis 30 (in this case, the clearance of first magnetic core structure 12/second magnetic core structure 16 denotes the smallest clearance of all mass points of first magnetic core structure 12/second magnetic core structure 16.) The placement options for magnetic core structures 10, 16 and 32 described in the two preceding paragraphs ensure measurements by coils 18, 20 and 34 that are (virtually) free of interference fields.

In the specific embodiment schematically illustrated in FIG. 2, first magnetic core structure 12 and third magnetic core structure 32 are positioned/developed in a cross structure such that their center longitudinal axes 10 and 30 lie in a common plane. A clearance between third magnetic core structure 32 and first center of mass S1 of first magnetic core structure 12 is therefore equal to zero. (Accordingly, a clearance between first magnetic core structure 12 and third center of mass S3 of third magnetic core structure 32 is also equal to zero.) It is possible, in particular, that the two centers of mass S1 and S3 coincide. To produce the positioning of the two magnetic core structures 12 and 32 schematically illustrated in FIG. 2, their materials may be sequentially deposited in such a way that a central magnetic core region 36 is formed that is shared by both magnetic core structures 12 and 32 and to which the two remaining magnetic core structures are connected independently.

The advantageous positioning of magnetic core structures 12 and 32 of FIG. 2 has the result that an interference field of the at least one first coil 18 within the volume of third magnetic core structure 32 is aligned in a direction normal to its central longitudinal axis 30, while a third magnetic field (not sketched), which is induced with the aid of at least one of the at least one third coil(s), has third field lines that extend perpendicular to first central longitudinal axis 10 in the volume of first magnetic core structure 12. As a result, all components are able to carry out a measurement that is unimpeded by an interference field.

The position of second magnetic core structure 16 in relation to the other magnetic core structures 12 and 32, for instance, is such that first end face 16a of second magnetic core structure 16 lies in a plane defined by first central longitudinal axis 10 and third central longitudinal axis 30. (In the example of FIG. 2, center longitudinal axes 10 and 30 and first end face 16a lie in the image plane.) The advantages of such a placement of second magnetic core structure 16 in relation to first magnetic core structure 12 are discernible from FIGS. 1a and 1b. Because of the perpendicular alignment of third magnetic core structure 32 in relation to first central longitudinal axis 10 and the close positioning of third magnetic core structure 32 at first magnetic core structure 12, the same advantages are also ensured for magnetic core structures 16 and 32.

In all of the afore-described specific embodiments, coils 18, 20 and 34 (as drive coils and/or detector coils) may be connected as separately controllable/energizable coils and/or in series. The at least one drive coil, for example, may be set up in such a way that an energization of the at least one drive coil makes it possible to induce at least locally a magnetic field in magnetic core structure 12, 16 or 32 of the individual drive coil. The at least one drive coil can be energized with the aid of an alternating current signal, in particular. A spontaneous magnetic reversal of the individual magnetic core structure 12, 16 and 32 may occur because of superpositioning of the magnetic field induced in the particular magnetic core structure 12, 16 and 32 with a further magnetic field, such as the earth's magnetic field. The spontaneous magnetic reversal of magnetic structure 12, 16 and 32 may be detectable with the aid of a voltage which is induced in the at least one detector coil. By analyzing an instant of the spontaneous magnetic reversal of magnetic coil structure 12, 16 and 32, it is subsequently possible to ascertain a field strength of the further magnetic field.

The afore-described specific embodiments are therefore advantageously able to be used for producing a 2D or 3D magnetic field sensor. Moreover, all specific embodiments are combinable with acceleration sensors. For example, a current direction with respect to the magnetic north pole is able to be determined from a sensor data fusion, which means that the specific embodiments are also suitable for a compass.

In the specific embodiments described above, the (smallest) clearance (of all points) of first end face 16a of second magnetic core structure 16 with respect to first center of mass S1 of first magnetic core structure 12 has been denoted by a1 or a2. This means that, depending on the positioning of magnetic core structures 12 and 16 in relation to each other, the clearance between first end face 16a of second magnetic core structure 16 and first center of mass S1, for instance may be a distance a1 of a center point of first end face 16a (see FIG. 1a) or a distance a2 of a corner point of first end face 16a (see FIG. 2). However, the examples mentioned here should not be interpreted as restricting.

Figure 3:
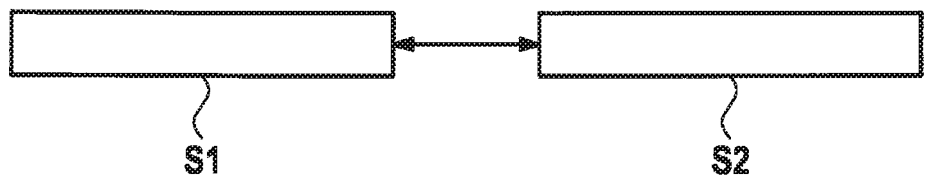
FIG. 3 shows a flow chart for explaining a manufacturing process for a magnetic sensor device.

FIG. 3 shows a flow chart for elucidating a manufacturing process of a conventional magnetic sensor device.

The manufacturing process described hereinafter is suitable for manufacturing all of the specific embodiments described above. However, it is pointed out that the feasibility of the manufacturing process is not limited to the manufacture of magnetic sensor devices of this type.

In a method step S1, a first magnetic core structure having at least one first coil is aligned/developed along a first central longitudinal axis in such a way that the windings of the at least one first coil extend around the first central longitudinal axis. In addition, in a method step S2, a second magnetic core structure having at least one second coil is aligned/developed along a second central longitudinal axis which lies in a plane that is aligned in a direction normal to the first central longitudinal axis. Method step S2 is executed in such a way that the second magnetic core structure extends from a first end face of the second magnetic core structure along the second central longitudinal axis to a second end face of the second magnetic core structure, and the windings of the at least one second coil extend around the second central longitudinal axis of the second magnetic core structure. (Definitions of the first end face and the second end face have already been provided.) When executing method steps S1 and S2 it is ensured that the position of second magnetic core structure in relation to the first magnetic core structure is such that a clearance between the first end face of the second magnetic core structure and a first center of mass of the first magnetic core structure is less than 20% of a maximum extension of the first magnetic core structure along the first central longitudinal axis.

Method steps S1 and S2 may be performed in any order or at the same time. In one advantageous further development, a third magnetic core structure having at least one third coil may be added as well, the windings of the at least one third coil extending around a third central longitudinal axis of the third magnetic core structure. The third central longitudinal axis of the third magnetic core structure is aligned in a direction normal to the first central longitudinal axis and in a direction normal to the second central longitudinal axis. Possibilities for an advantageous placement of the three magnetic core structures in relation to each other have already been described above.

What is claimed is:

1. A magnetic sensor device, comprising:
  a first magnetic core structure which is aligned along a first central longitudinal axis and includes at least one first coil, windings of the at least one first coil extending around the first central longitudinal axis of the first magnetic core structure;
  a second magnetic core structure having at least one second coil, the second magnetic core structure extending from a first end face of the second magnetic core structure along a second central longitudinal axis to a second end face of the second magnetic core structure, and windings of the at least one second coil extending around the second central longitudinal axis of the second magnetic core structure; and
  a third magnetic core structure which is aligned along a third central longitudinal axis and includes at least one third coil, windings of the at least one third coil extending around the third central longitudinal axis of the third magnetic core structure;

wherein:

the second central longitudinal axis lies in a plane aligned in a direction normal to the first central longitudinal axis, and a position of the second magnetic core structure in relation to the first magnetic core structure being such that a clearance between the first end face of the second magnetic core structure and a first center of mass of the first magnetic core structure is less than 20% of a maximum extension of the first magnetic core structure along the first central longitudinal axis, the third central longitudinal axis being aligned in a direction normal to the first central longitudinal axis and in a direction normal to the second central longitudinal axis;

a position of the third magnetic core structure in relation to the first magnetic core structure and the second magnetic core structure is such that the third central longitudinal axis extends through the first center of mass of the first magnetic core structure, the first magnetic core structure and the third magnetic core structure being developed in a cross structure such that the first central longitudinal axis and the third central longitudinal axis lie in a common plane.

2. The magnetic sensor device as recited in claim 1, wherein a third center of mass of the third magnetic core structure and the first center of mass of the first magnetic core structure coincide.

3. The magnetic sensor device as recited in claim 1, wherein the first magnetic core structure and the third magnetic core structure are formed in such a way that a central magnetic core region is formed that is shared by the first magnetic core structure and the third magnetic core structure.

4. The magnetic sensor device as recited in claim 1, further comprising:

at least of: i) at least one drive coil, and ii) at least one detector coil as the at least one coil, is situated on at least one of the magnetic core structures.

5. A method for manufacturing a magnetic sensor device, comprising:

aligning a first magnetic core structure having at least one first coil along a first central longitudinal axis in such a way that windings of the at least one first coil extend around the first central longitudinal axis;

aligning a second magnetic core structure having at least one second coil along a second central longitudinal axis, which lies in a plane that is aligned in a direction normal to the first central longitudinal axis, such that the second magnetic core structure extends from a first end face of the second magnetic core structure along the second central longitudinal axis to a second end face of the second magnetic core structure, and windings of the at least one second coil extend around the second central longitudinal axis of the second magnetic core structure, the position of the second magnetic core structure in relation to the first magnetic core structure being such that a clearance between the first end face of the second magnetic core structure and a first center of mass of the first magnetic core structure is less than 20% of a maximum extension of the first magnetic core structure along the first central longitudinal axis; and adding a third magnetic core structure having at least one third coil, windings of the at least one third coil extending around a third central longitudinal axis of the third magnetic core structure, the third central longitudinal axis of the third magnetic core structure being aligned in a direction normal to the first central longitudinal axis and in a direction normal to the second central longitudinal axis;

wherein a position of the third magnetic core structure in relation to the first magnetic core structure and the second magnetic core structure is such that the third central longitudinal axis extends through the first center of mass of the first magnetic core structure, and the first magnetic core structure and the third magnetic core structure being developed in a cross structure so that the first central longitudinal axis and the third central longitudinal axis lie in a common plane.

* * * * *